United States Patent
Kang et al.

(10) Patent No.: US 9,842,787 B2
(45) Date of Patent: Dec. 12, 2017

(54) ELECTRONIC ELEMENT PACKAGE AND METHOD FOR MANUFACTURING THE SAME

(71) Applicant: Samsung Electro-Mechanics Co., Ltd., Suwon-si (KR)

(72) Inventors: Pil Joong Kang, Suwon-si (KR); Kwang Su Kim, Suwon-si (KR); Ji Hye Nam, Suwon-si (KR); Jeong Il Lee, Suwon-si (KR); Jong Hyeong Song, Suwon-si (KR); Yun Sung Kang, Suwon-si (KR); Seung Joo Shin, Suwon-si (KR); Nam Jung Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/275,603

(22) Filed: Sep. 26, 2016

(65) Prior Publication Data

US 2017/0271222 A1    Sep. 21, 2017

(30) Foreign Application Priority Data

Mar. 17, 2016  (KR) .................. 10-2016-0032183

(51) Int. Cl.
*H01L 23/498* (2006.01)
*H01L 23/10* (2006.01)
(Continued)

(52) U.S. Cl.
CPC .......... *H01L 23/10* (2013.01); *H01L 21/4817* (2013.01); *H01L 23/49816* (2013.01);
(Continued)

(58) Field of Classification Search
CPC .............. H01L 23/10; H01L 23/49816; H01L 21/4817; H01L 23/49827; H01L 23/28; H01L 23/315; H01L 23/3178; H01L 2924/181; H01L 21/563; H01L 23/49575; H01L 21/56; H01L 21/565; H01L 23/3135; H01L 23/3675; H01L 23/49541;
(Continued)

(56) References Cited

U.S. PATENT DOCUMENTS

2001/0018236 A1*  8/2001  Badehi .................. B81B 7/0067
438/127

FOREIGN PATENT DOCUMENTS

JP          9-122924 A    5/1997
JP          4435040 B2    3/2010
(Continued)

OTHER PUBLICATIONS

English Translation KR10-2007-0016855.*

*Primary Examiner* — Caleen Sullivan
(74) *Attorney, Agent, or Firm* — NSIP Law (57) ABSTRACT

The present disclosure relates to an electronic element package and a method of manufacturing the same. The electronic element package includes a substrate, an element disposed on the substrate, and a cap enclosing the element. One of the substrate and the cap includes a groove, the other of the substrate and the cap includes a protrusion engaging with the groove. A first metal layer and a second metal layer form a metallic bond with each other in a space between the groove and the protrusion.

12 Claims, 7 Drawing Sheets

(51) Int. Cl.
  *H01L 21/48* (2006.01)
  *H03H 9/02* (2006.01)
  *H03H 3/02* (2006.01)
  *H03H 9/13* (2006.01)

(52) U.S. Cl.
  CPC ......... *H01L 23/49827* (2013.01); *H03H 3/02* (2013.01); *H03H 9/02007* (2013.01); *H03H 9/13* (2013.01); *H03H 2003/021* (2013.01)

(58) Field of Classification Search
  CPC ............... H01L 23/49861; H01L 25/00; H01L 2924/15153; H01L 31/048; H01L 21/52; H01L 2224/05017; H01L 2224/05557; H01L 2225/06582; H01L 23/16; H01L 41/23; H01L 21/4821; H01L 25/165; H01L 2924/16151; H03H 9/13; H03H 9/02007; H03H 3/02; H03H 2003/02
  USPC ........................................................ 257/416
  See application file for complete search history.

(56) References Cited

FOREIGN PATENT DOCUMENTS

KR  10-2007-0016855 A  2/2007
KR  10-2011-0122242 A  11/2011

\* cited by examiner

ELECTRONIC ELEMENT PACKAGE AND METHOD FOR MANUFACTURING THE SAME

CROSS-REFERENCE TO RELATED APPLICATION

This application claims benefit under 35 USC 119(a) of priority to Korean Patent Application No. 10-2016-0032183 filed on Mar. 17, 2016 in the Korean Intellectual Property Office, the disclosure of which is incorporated herein by reference in its entirety.

BACKGROUND

1. Field

The present disclosure relates to an electronic element package and a method for manufacturing the same.

2. Description of Related Art

Recently, with the recent rapid development of mobile communications devices, the demand for macrofilters, oscillators, and other components has increased. For example, bulk acoustic wave (BAW) resonators have been regularly used to implement macrofilters, oscillators, and other components. Using BAW resonators have advantages such as enabling mass production at low cost and allowing for macrominiaturization. Furthermore, BAW resonators enables a high quality factor to be obtained and may be used in macrofrequency bands.

In general, because performance of resonators (vibrators) of BAW resonators degrade at a bonding temperature of 500° C. or more, the BAW resonators need to be hermetically sealed at a low temperature of 500° C. or less. Thus, thermal diffusion bonding, eutectic bonding or silicon direct bonding may be applied.

Furthermore, BAW resonators often use thermal diffusion bonding in a cap bonding process. Thermal diffusion bonding is defined as a method of spreading materials to be bonded, for example, bonding metals, on two surfaces of wafers and pressing the wafers using heat and strong force to bond the wafers. The strong force first functions to press the wafers together to have a gap having a nano size or less so that the spread bonding metals are in close proximity to each other and fuse together. When the pressed wafers are heated, the bonding metals formed on the respective wafers fuse together so that the wafers may be bonded.

In this example, the spread bonding metals represent membrane thickness distribution within the wafers depending on membrane conditions, and the thicknesses of the wafers that form a base of the bonding metals and have a constant degree of thickness distribution. In order to press the wafers having such thickness distribution against each other, a high degree of force is required, and a bonding metal that has high ductility and that may be relatively easily transformed by the same degree of force is needed. Furthermore, equipment able to perform a bonding process requires a high degree of pressure. Moreover, inch-up processes for substrates are required such that microelectromechanical systems (MEMS) devices including up-to-date BAW resonators are of reasonable cost. For the inch-up processes, bonding pressure needs to be increased in proportion to inch-up.

Furthermore, such thermal press bonding may be performed under the condition that a surface to be bonded is required to have a surface in a pure state in which oxidation has not occurred. Thus, Au—Au diffusion bonding is used, in which oxidation barely occurs and provides excellent ductility at high temperatures and under atmospheric conditions. Use of Au—Au diffusion bonding results in an increase in manufacturing costs.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, a bonding structure and method thereof are configured to include bonding a metal layer covering a protrusion formed on one side of a bonding portion to a metal layer covering a groove formed on another side of the bonding portion.

In accordance with an embodiment, there is provided an electronic element package including: a substrate; an element disposed on the substrate; and a cap enclosing the element, wherein one of the substrate and the cap may include a groove, the other of the substrate and the cap may include a protrusion engaging with the groove, and a first metal layer and a second metal layer forming a metallic bond with each other in a space between the groove and the protrusion.

The groove may include an inclined wall surface, and the metallic bond may be a bond between a portion of the first metal layer covering an edge of the protrusion of the first metal layer and a portion of the second metal layer covering the inclined wall surface of the groove of the second metal layer.

The metallic bond may include a metal thermal diffusion layer.

The first metal layer and the second metal layer may include a same type of material.

The substrate and the cap may include a resin layer disposed in a space therebetween to form a resin bond.

The resin layer may include an epoxy resin.

The electronic element package may be a BAW resonator.

In accordance with another embodiment, there is provided a method of manufacturing an electronic element package including: forming an element on a surface of a substrate; and bonding a cap enclosing the element to the substrate, wherein one of the substrate and the cap may include a groove, the other of the substrate and the cap may include a protrusion engaging with the groove, and the bonding the cap to the substrate may include metallically bonding a first metal layer to a second metal layer, formed in a space between the groove and the protrusion.

The groove may include an inclined wall surface, and the metallically bonding of the first metal layer to the second metal layer may include bonding a portion of the first metal layer covering an edge of the protrusion of the first metal layer to a portion of the second metal layer covering the inclined wall surface of the groove.

The metallically bonding the first metal layer to the second metal layer may be performed using a metal thermal diffusion bonding process.

The bonding the cap to the substrate further may include resin-bonding the cap to the substrate using a resin layer.

The resin layer may be disposed on either one or both of the substrate and the cap before the resin-bonding, and may be disposed in a space between the substrate and the cap after the resin-bonding the substrate to the cap.

In accordance with a further embodiment, there is provided an electronic element package, including: an element disposed on a substrate; a cap configured to cover the element on the substrate; a protrusion formed on one of a lower surface of a side wall of the cap or on an upper surface of the substrate; a first metal layer covering at least one surface of the protrusion; a groove formed on another of the lower surface of the side wall of the cap or on the upper surface of the substrate; and a second metal layer covering the groove, wherein a metallic bond may be configured between at least a portion of the first metal layer and the second metal layer.

The groove may be a recess having an inclined wall side surface for line bonding and a flat surface as a bottom surface.

Upon the protrusion being formed on the lower surface of the side wall of the cap, the first metal layer extends from a predetermined point on the lower surface of the side wall, covering side surfaces and a lower surface of the protrusion, and extending to another predetermined point of the lower surface of the side wall.

Upon the groove being formed on the upper surface of the substrate, the second metal layer extends from a predetermined point on the upper surface of the substrate, covering inclined wall surfaces and a flat surface of the groove, and extending to another predetermined point of the upper surface of the substrate.

A resin layer may be formed on the bonding surface of the side wall of the cap or the bonding surface of the substrate to resin-bond the lower surface of the side wall of the cap to the upper surface of the substrate using the resin layer.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Electronic Device Module

Figure 1:
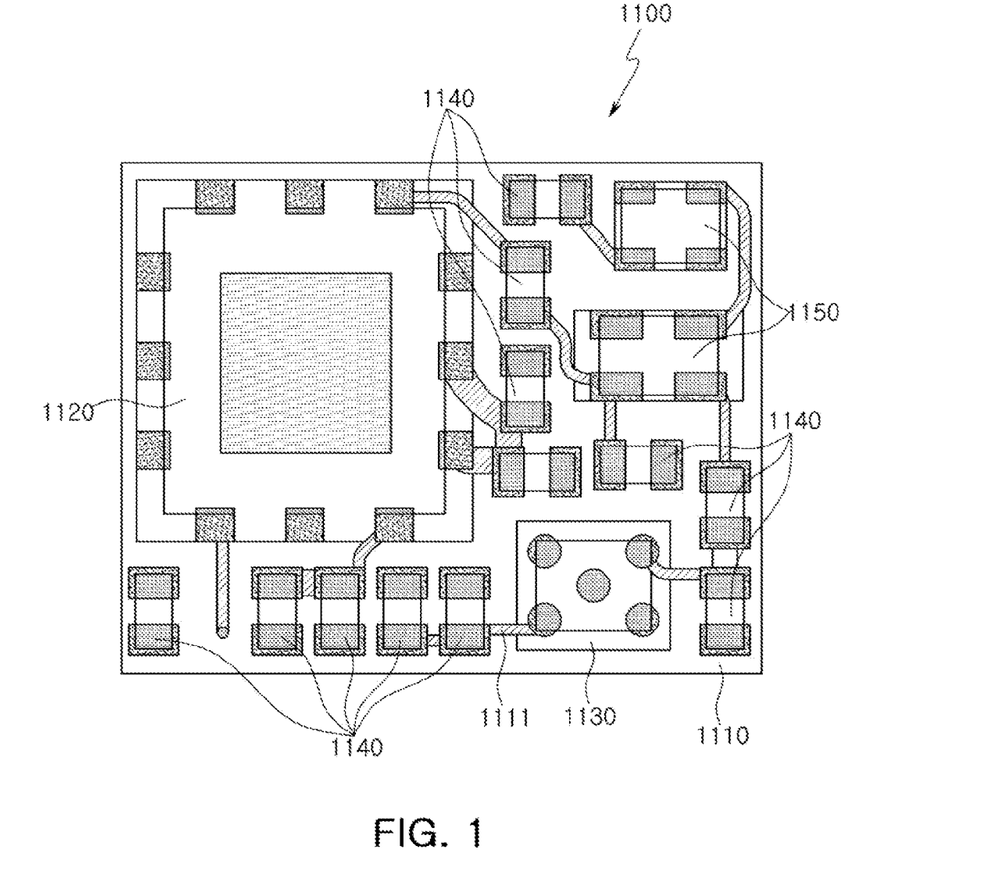
FIG. 1 is a schematic plan view of an electronic device module, in accordance with an embodiment.

FIG. 1 is a schematic plan view of an electronic device module, in accordance with an embodiment.

Referring to FIG. 1, an electronic device module 1100 includes various types of electronic components. For example, various types of passive components 1140 and 1150 and an electronic element package 1130 are mounted around an integrated circuit (IC) chip 1120 on a printed circuit board (PCB) 1110 of the electronic device module 1100. These components are electrically connected to one another through a circuit 1111, and various signals are transmitted or received through the circuit 1111.

The IC chip 1120 is a memory chip such as a volatile memory (for example, a dynamic random access memory (DRAM)), a non-volatile memory (for example, a read only memory (ROM)), or a flash memory; an application processor chip such as a central processor (for example, a central processing unit (CPU)), a graphic processor (for example, a graphic processing unit (GPU)), a digital signal processor, a cryptographic processor, a microprocessor, a microcontroller, or the like; and a logic chip such as an analog-to-digital converter (ADC), or an application-specific integrated circuit (ASIC). However, the present disclosure is not limited thereto, but the IC chip 1120 may also include other types of chip related components. These chip related components are also combined.

The passive components 1140 and 1150 may be various types of filters used to remove noise, for example, a power inductor, a high frequency (HF) inductor, a general bead, a GHz bead, a common mode filter, and the like. However, the present disclosure is not limited thereto, and the passive components 1140 and 1150 may be other passive components, such as various types of capacitors. These passive components are also combined.

The element package 1130 includes various types of micro-electro-mechanical systems (MEMS) devices, and may be, for example, a bulk acoustic wave (BAW) device, or a surface acoustic wave (SAW) device. However, the present disclosure is not limited thereto. These devices are used as filters to transmit or receive a radio frequency (RF) signal. The element package 1130, according to an embodiment, may be such an RF filter. However, the present disclosure is not limited thereto. The element package 1130 may also be other element packages to which a bonding structure described below is applied.

The electronic device module 1100 may be a typical Wi-Fi module. However, the present disclosure is not limited thereto. For example, the electronic device module 1100 may be a module used in an electronic device, such as a smartphone, a personal digital assistant, a digital video camera, a digital still camera, a network system, a computer, a monitor, a television, a video game console, or a smartwatch.

Electronic Element Package

An element package, according to an embodiment, will hereinafter be described, and for convenience, the structure of a BAW resonator is described with an example. However, the contents, according to an embodiment, may be applied to element packages having various different purposes as described above.

Figure 2:
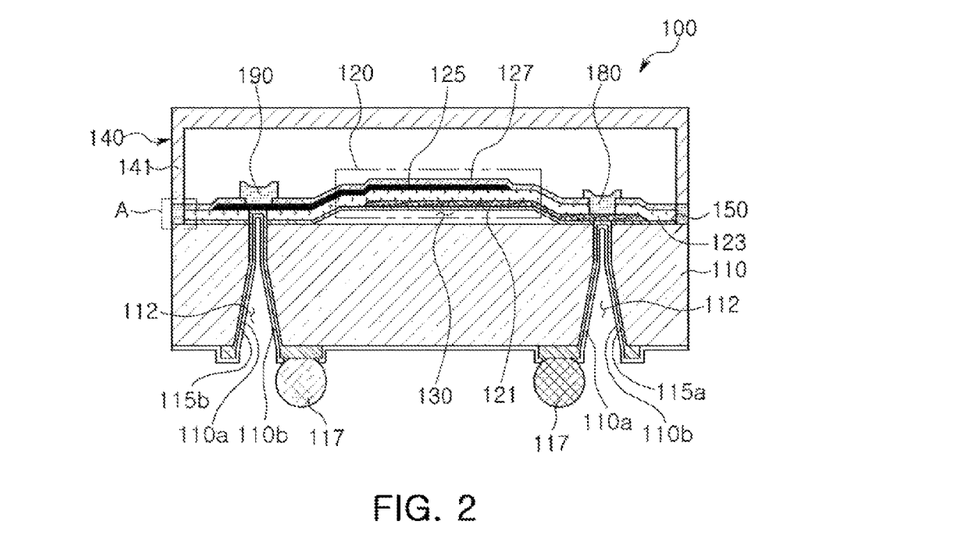
FIG. 2 is a schematic cross-sectional view of an element package, in accordance with an embodiment.

FIG. 2 is a schematic cross-sectional view of an electronic element package, in accordance with an embodiment.

Referring to FIG. 2, an electronic element package 100, according to an embodiment, includes a substrate 110, an element 120, and a cap 140. An air gap 130 is formed in a space between the substrate 110 and the element 120, and the element 120 is formed on a membrane layer 150 to be spaced apart from the substrate 110 by the air gap 130.

The substrate 110 may be a silicon (Si) substrate, a high resistance silicon (HRS) substrate, a gallium arsenide (GaAs) substrate, a glass substrate, a ceramic substrate, or a silicon on insulator (SOI). However, the present embodiment is not limited thereto.

The element 120 includes a first electrode 121, a piezoelectric layer 123, and a second electrode 125. The element 120 is formed by sequentially stacking the first electrode 121, the piezoelectric layer 123, and the second electrode 125 from or on the membrane layer 150. Thus, the piezoelectric layer 123 is disposed in a space between the first electrode 121 and the second electrode 125. The element 120 is formed on the membrane layer 150 and, resultantly, the membrane layer 150, the first electrode 121, the piezoelectric layer 123, and the second electrode 125 are sequentially formed on an upper portion of the substrate 110.

The element 120 resonates with the piezoelectric layer 123 at a signal, applied to the first electrode 121 and the second electrode 125, to generate a resonant frequency or a half resonant frequency. The first electrode 121 and the second electrode 125 are formed of metals, such as gold (Au), molybdenum (Mo), lutetium (Lu), aluminum (Al), platinum (Pt), titanium (Ti), tungsten (W), palladium (Pd), chromium (Cr), and nickel (Ni). However, the present disclosure is not limited thereto.

The element 120 uses acoustic waves generated by the piezoelectric layer 123. For example, when a signal is applied to the first electrode 121 and the second electrode 125, the piezoelectric layer 123 mechanically vibrates in a thickness direction thereof to generate acoustic waves. In an embodiment, the piezoelectric layer 123 includes a zinc oxide (ZnO), an aluminum nitride (AlN), or quartz.

A resonance phenomenon of the piezoelectric layer 123 occurs when ½ of an applied signal wavelength corresponds to the thickness of the piezoelectric layer 123. When the resonance phenomenon occurs, electrical impedance rapidly changes, and an acoustic wave resonator, according to an embodiment, may be used as a filter that selects a frequency. The resonant frequency is determined depending on the thickness of the piezoelectric layer 123, the first electrode 121 and the second electrode 125 surrounding the piezoelectric layer 123, or the particular elastic wave velocity of the piezoelectric layer 123. As an example, as the thickness of the piezoelectric layer 123 is reduced, the resonant frequency increases.

The element 120 further includes a protective layer 127. The protective layer 127 is formed on an upper portion of the second electrode 125 to prevent the second electrode 125 from being exposed to an external environment. The first electrode 121 and the second electrode 125 are formed on opposite outside or exterior surfaces of the piezoelectric layer 123, and are connected to a first connecting electrode 180 and a second connecting electrode 190, respectively.

The first connecting electrode 180 and the second connecting electrode 190 confirm filter characteristics of a resonator, and perform required frequency trimming. The present disclosure is not, however, limited thereto.

The element 120 is spaced apart from the substrate 110 by the air gap 130 in order to increase quality factor. For example, the air gap 130 is formed in a space between the element 120 and the substrate 110 so that the substrate 110 does not affect or influence acoustic waves generated by the piezoelectric layer 123. Further, the air gap 130 allows reflection characteristics of acoustic waves, generated by the element 120, to be improved. As an empty space, the air gap 130 has approximately infinite impedance, and thus, acoustic waves are not lost or do not propagate in the air gap 130, and remain in the element 120. Thus, the air gap 130 enables an acoustic wave loss to be reduced in a longitudinal direction thereof, resulting in an increase in a quality factor value of the element 120.

A plurality of via holes 112 passing through the substrate 110 are formed towards a lower surface of the substrate 110. A first connecting conductor 115a and a second connecting conductor 115b are formed inside the via holes 112, respectively. The first and second connecting conductors 115a and 115b are formed on internal surfaces of the via holes 112, that is, the entirety of a first inner wall 110a and a second inner wall 110b of the substrate 110. However, the present disclosure is not limited thereto. One end of each of the first and second connecting conductors 115a and 115b is connected to external electrodes 117 formed on the lower surface of the substrate 110, and the other end thereof is connected to the first electrode 121 or the second electrode 125.

In an example, the first connecting conductor 115a electrically connects the first electrode 121 to the external electrode 117, and the second connecting conductor 115b electrically connects the second electrode 125 to the external electrode 117. Thus, the first connecting conductor 115a is electrically connected to the first electrode 121 through the substrate 110 and the membrane layer 150, and the second connecting conductor 115b is electrically connected to the second electrode 125 through the substrate 110, the membrane layer 150, and the piezoelectric layer 123.

Furthermore, in an example, only two via holes 112 and two connecting conductors 115a and 115b are illustrated. However, the present disclosure is not limited thereto. Based on an embodiment, a greater numbers of via holes 112 and connecting conductors 115a and 115b may be provided.

The cap 140 protects the element 120 from an exterior of the element package 100 or from an external environment. The cap 140 includes two side walls 141, each side wall 141 extending from opposite width ends of the substrate 110, toward a flat surface covering the element 120. The cap 140 has a cover shape, with a flat or a curved top surface, including an internal space in which the element 120 is accommodated. Thus, the cap 140 is bonded, soldered, welded, or attached to the substrate 110 to allow a side wall 141 of the cap 140 to surround the periphery of the element 120. Further, a lower surface 141a of the side wall 141 is used as a bonding surface that is bonded, soldered, welded, or attached to the substrate 110. In one embodiment, a different, separate structure may be formed in a space between the cap 140 and the substrate 110. A material of the cap 140 is not particularly limited. The cap 140 may be made, for example, of a polymer material, such as a thermosetting resin or a thermoplastic resin, or may be made of a known metal or semiconductor material. However, the present disclosure is not limited thereto.

Figure 3:
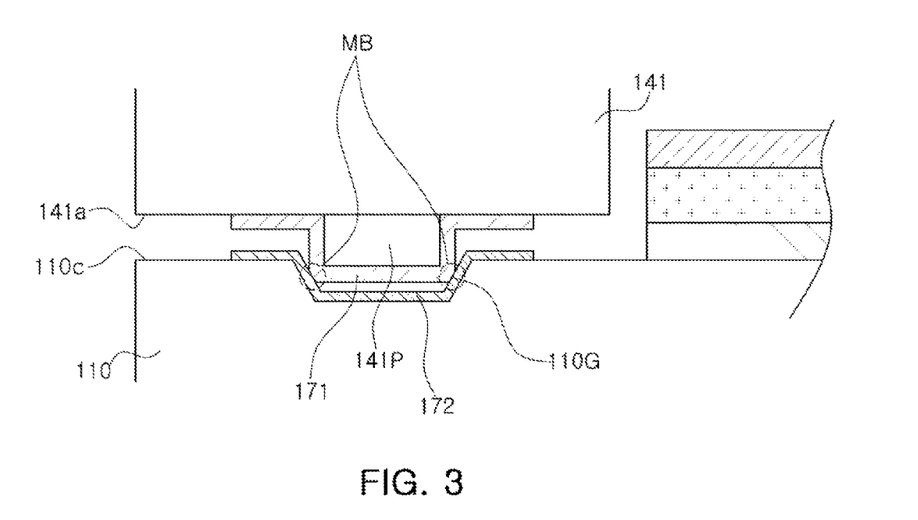
FIG. 3 is a schematic enlarged cross-sectional view of region A of FIG. 2, in accordance with an embodiment.

FIG. 3 is a schematic enlarged cross-sectional view of region A of FIG. 2, in accordance with an embodiment.

Referring to FIG. 3, a bonding portion A, according to an embodiment, includes a protrusion 141P formed on a lower surface 141a of the side wall 141 of the cap 140, a first metal layer 171 covering the protrusion 141P, a groove 110G formed on the substrate 110, and a second metal layer 172 covering the groove 110G. A metallic bond (MB) is configured between at least a portion of the first metal layer 171 covering the protrusion 141P formed on the cap 140 and the second metal layer 172 covering the groove 110G formed on the substrate 110.

The groove 110G is a recess having an inclined wall surface, as a side surface, for line bonding and a flat surface as a bottom surface and is formed on an upper surface 110c of the substrate 110. The portion highlighted in a dashed circle in FIG. 3 is the portion of the groove 110G in which the first metal layer 171 and the second metal layer 172 are in closest proximity to each other or in contact with each other. In accordance with an embodiment, the first metal layer 171 covers at least one surface of the protrusion 141P. For instance, as shown in FIG. 3, the first metal layer 171 extends from a predetermined point on the lower surface 141a of the side wall 141, covering side surfaces and a lower surface of the protrusion 141P, and extending to another predetermined point of the lower surface 141a of the side wall 141. Furthermore, the second metal layer 172 extends from a predetermined point on the upper surface 110c of the substrate 110, covering the inclined wall surfaces and the flat surface of the groove 110G, and extending to another predetermined point of the upper surface 110c of the substrate 110.

The MB bonds a portion of the first metal layer 171 covering a corner or a portion of an edge of the protrusion 141P of the first metal layer 171 that overlaps with or that faces a portion of the second metal layer 172 that covers the inclined wall surface of the groove 110G of the second metal layer 172. Thus, an intermetallic bonding surface is not formed in a space between portions of the groove 110G rather than on a planar surface. Even in the case that a desired total thickness value (TTV) is not obtained, an insertion depth of the protrusion 141P automatically varies to form a regular bonding line. In other words, self-alignment is possible, at least, in accordance with an embodiment as illustrated in FIG. 3. Further, even in the case that a bonding line is not formed to have a very fine pattern of about 1 μm to 2 μm, a line bond is achieved in terms of shape, and the area of an intermetallic bonding surface is significantly reduced. Further, as the area or the like is increased, when the pressure limit of bonding equipment is exceeded, an intermetallic bonding surface having a fine line width is formed using a plating process, for example, without applying a high level process.

The first and second metal layers 171 and 172 also include metals, such as copper (Cu) that easily oxidizes, as well as gold (Au) used in a common metal thermal diffusion process. Further, the first and second metal layers 171 and 172 are necessarily made of different types of materials, and may be made of the same type of material because lines formed between side surfaces of metal layers are bonded while pressurizing surfaces of the metal layers from below, without forming a metallic bond by pressurizing the surfaces. Thus, an internal pure metal is exposed instead of an oxidized surface, so that an easily oxidized bonding metal, such as copper (Cu), can also be used as a material for a thermal diffusion bonding process. Thus, in accordance with one of the many advantages of the present disclosure, manufacturing costs are reduced.

The first and second metal layers 171 and 172 are bonded by a metal thermal diffusion process and stop conduction of heat. Thus, the first and second metal layers 171 and 172 have a metal thermal diffusion layer formed thereon due to counter diffusion between the first and second metal layers 171 and 172.

Furthermore, the groove 110G formed on the substrate 110, and the protrusion 141P formed on the cap 140 to engage with the groove 110G. This is illustrated in the drawings. However, the present disclosure is not limited thereto. For example, as long as the cap 140 and the substrate 110 form such an MB, the groove 110G may be formed on the cap 140, such as the lower surface 141a of the side wall 141 of the cap 140, and the protrusion 141P engaging with the groove 110G may be formed on the substrate 110, such as the upper surface 110c of the substrate 110. In the following description, this will be apparent after an understanding of the disclosure of this application through reference to the appended drawings in their entirety.

Figure 4:
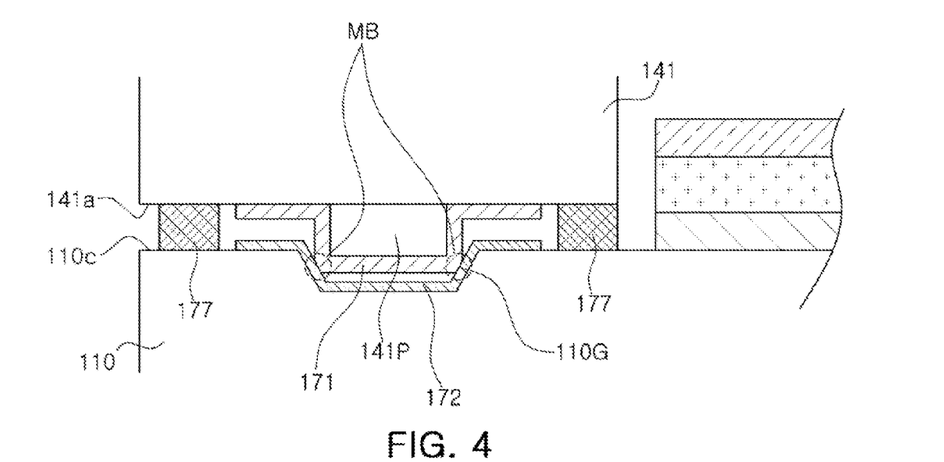
FIG. 4 is another schematic enlarged cross-sectional view of region A of FIG. 2, in accordance with an embodiment.

FIG. 4 is another example of a schematic enlarged cross-sectional view of region A of FIG. 2, in accordance with an embodiment.

Referring to FIG. 4, a bonding portion A, according to an embodiment, includes a protrusion 141P formed on a cap 140, a first metal layer 171 covering the protrusion 141P, a groove 110G formed on a substrate 110, and a second metal layer 172 covering the groove 110G. The bonding portion A further includes a resin bond formed by a resin layer 177.

The resin layer 177 is disposed or positioned in a space between the substrate 110 and the cap 140, for example, in a space between an upper surface 110c or a bonding surface 110c of the substrate 110 and a lower surface 141a or a bonding surface 141a of the cap 140. The resin layer 177 bonds the substrate 110 and the cap 140. When the MB and resin bond by the resin layer 177 are simultaneously applied, the MB and the resin bond are combined in a manner of assisting a hermetic seal in an MB region and bonding strength in a resin bonding region, through the resin layer 177.

The resin layer 177 includes known resins, and may include an epoxy resin among the known resins in order to increase bonding strength obtained by an epoxy bonding process. However, the present disclosure is not limited thereto.

Method of Manufacturing Electronic Element Package

An example of manufacturing an electronic element package will hereinafter be described. An overlap with the abovementioned description is omitted, and a difference therefrom is primarily described.

Figure 5:
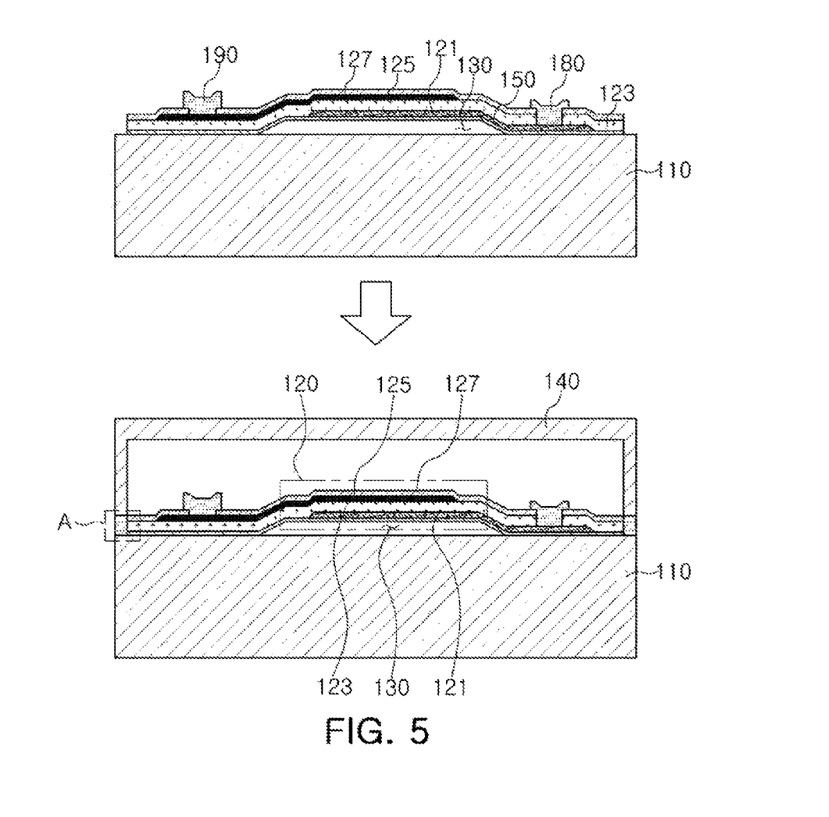
FIGS. 5 and 6 are schematic cross-sectional views of manufacturing an electronic element package, in accordance with an embodiment.

FIG. 5 is a schematic cross-sectional view of part of manufacturing an electronic element package, in accordance with an embodiment.

Referring to FIG. 5, an element 120 is formed on a substrate 110. The element 120 is formed by sequentially stacking a membrane layer 150, a first electrode 121, a piezoelectric layer 123, a second electrode 127, and a protective layer 127 on the substrate 110. A sacrificial layer (not illustrated) is formed prior to the formation of the membrane layer 150, and is removed later to form an air gap 130. The first electrode 121 and the second electrode 125 are formed as a predetermined pattern by forming a conductive layer, depositing a photoresist on an upper portion of the conductive layer, patterning the photoresist using a photolithography process, and using the patterned photoresist as a mask.

In an embodiment, the first electrode 121 is formed of a molybdenum (Mo) material, and the second electrode 125 is formed of a ruthenium (Ru) material. However, the present disclosure is not limited thereto, and a variety of metals, such as a gold (Au), ruthenium (Ru), aluminum (Al), platinum (Pt), titanium (Ti), tungsten (W), palladium (Pd), chromium (Cr), and nickel (Ni), are used as the first and second electrodes 121 and 125, depending on an embodiment. The piezoelectric layer 123 is formed of an aluminum nitride (AlN). However, the present disclosure is not limited thereto, and various piezoelectric materials, such a zinc oxide (ZnO) or quartz, are used. The protective layer 127 is formed of an insulating material. In an example, an insulating material includes a silicon oxide-based, silicon nitride-based, or aluminum nitride-based material.

Subsequently, a first connecting electrode 180 and a second connecting electrode 190 for frequency trimming are formed on upper portions of the first electrode 121 and the second electrode 125, respectively. The first and second connecting electrodes 180 and 190 are formed on the upper portions of the first and second electrodes 121 and 125, and are bonded to the first and second electrodes 121 and 125 through the protective layer 127 or the piezoelectric layer 123. The first connecting electrode 180 is formed by removing portions of the protective layer 127 and the piezoelectric layer 123 by an etching process to externally expose a portion of the first electrode 121, and by depositing gold (Au), or copper (Cu), on the first electrode 121. Similarly, the second connecting electrode 190 is formed by partially removing a portion of the protective layer 127 by an etching process to externally expose a portion of the second electrode 125, and by depositing gold (Au), copper (Cu), or the like, on the second electrode 125.

Subsequently, use of the first and second connecting electrodes 180 and 190 allows filter characteristics of the element 120 to be confirmed and a required frequency to be trimmed, and an air gap 130 is then formed. The air gap 130 is formed by removing the sacrificial layer. As result, the element 120, a resonant portion, is completed.

Furthermore, a cap 140 is formed to protect the element 120 from an external environment. The cap 140 is formed by a wafer bonding process at a wafer level. For example, a substrate wafer on which a plurality of unit substrates 110 are disposed and a cap wafer on which a plurality of caps 140 are disposed are bonded to each other to be an integral wafer. In this example, the substrate wafer and the cap wafer bonded to each other are cut into a plurality of separate element packages in a subsequent cutting process. Further, the cap 140 is seated on the substrate 110. The cap 140 and the substrate 110 are heated and pressed to be bonded to each other. A bonding process will be described below in more detail.

Figure 6:
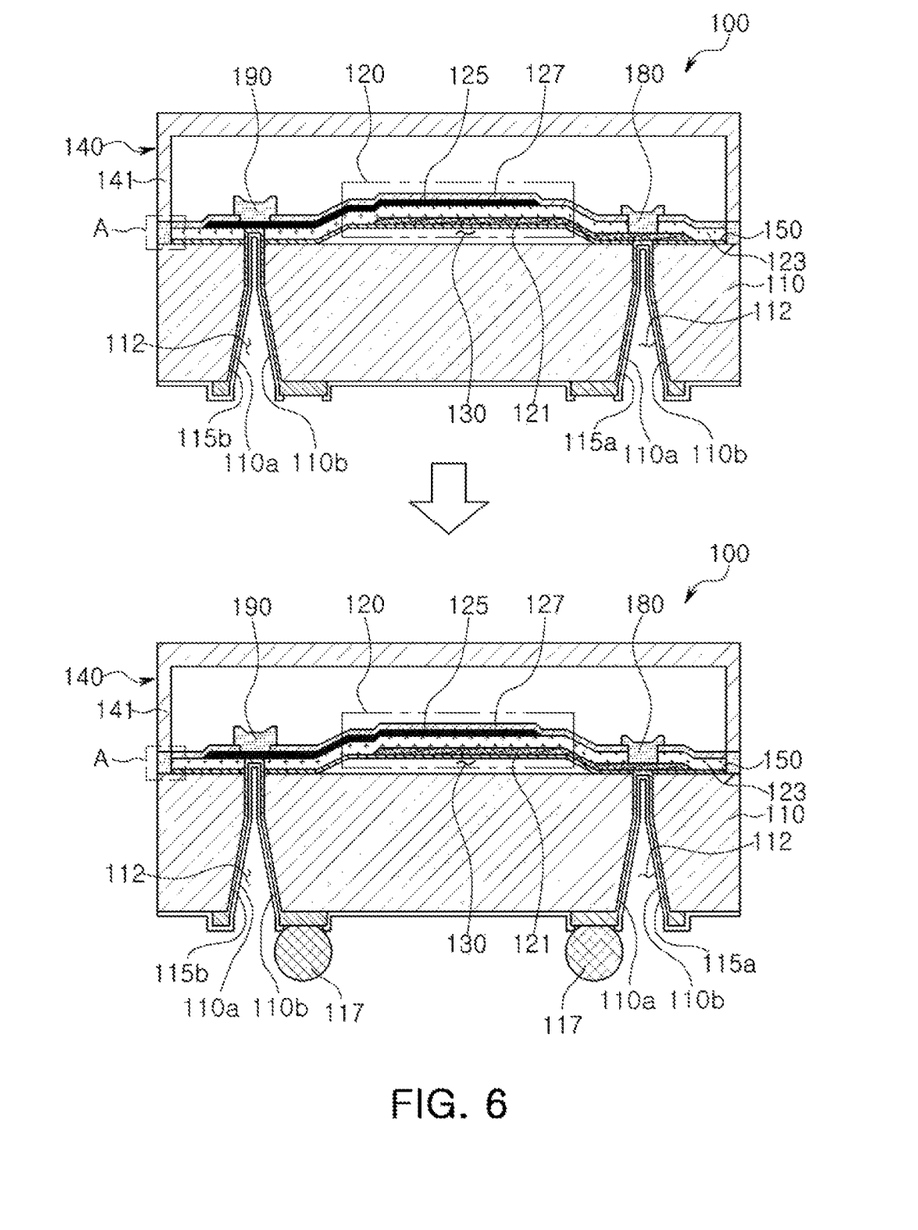

FIG. 6 is a schematic cross-sectional view of part of manufacturing an electronic element package, in accordance with an embodiment.

Referring to FIG. 6, via holes 112 are formed through the substrate 110, and first and second connecting conductors 115a and 115b are formed inside of the via holes 112. The first and second connecting conductors 115a and 115b are manufactured by forming conductive layers on internal surfaces 110a and 110b of the substrate 110 forming the via holes 112. For example, the first and second connecting conductors 115a and 115b are formed by depositing, coating, or providing conductive metals (for example, gold (Au) or copper (Cu)) along a first inner wall 110a and a second inner wall 110b of the substrate 110 forming the via holes 112.

Also, external electrodes 117 are formed on a lower surface of the substrate 110 to complete the electronic element package 100. The external electrodes 117 are formed on the first and second connecting conductors 115a and 115b extending to the lower surface of the substrate 110. A solder ball formed of Tin (Sn) is used as the external electrodes 117, but the present disclosure is not limited thereto.

Figure 7:
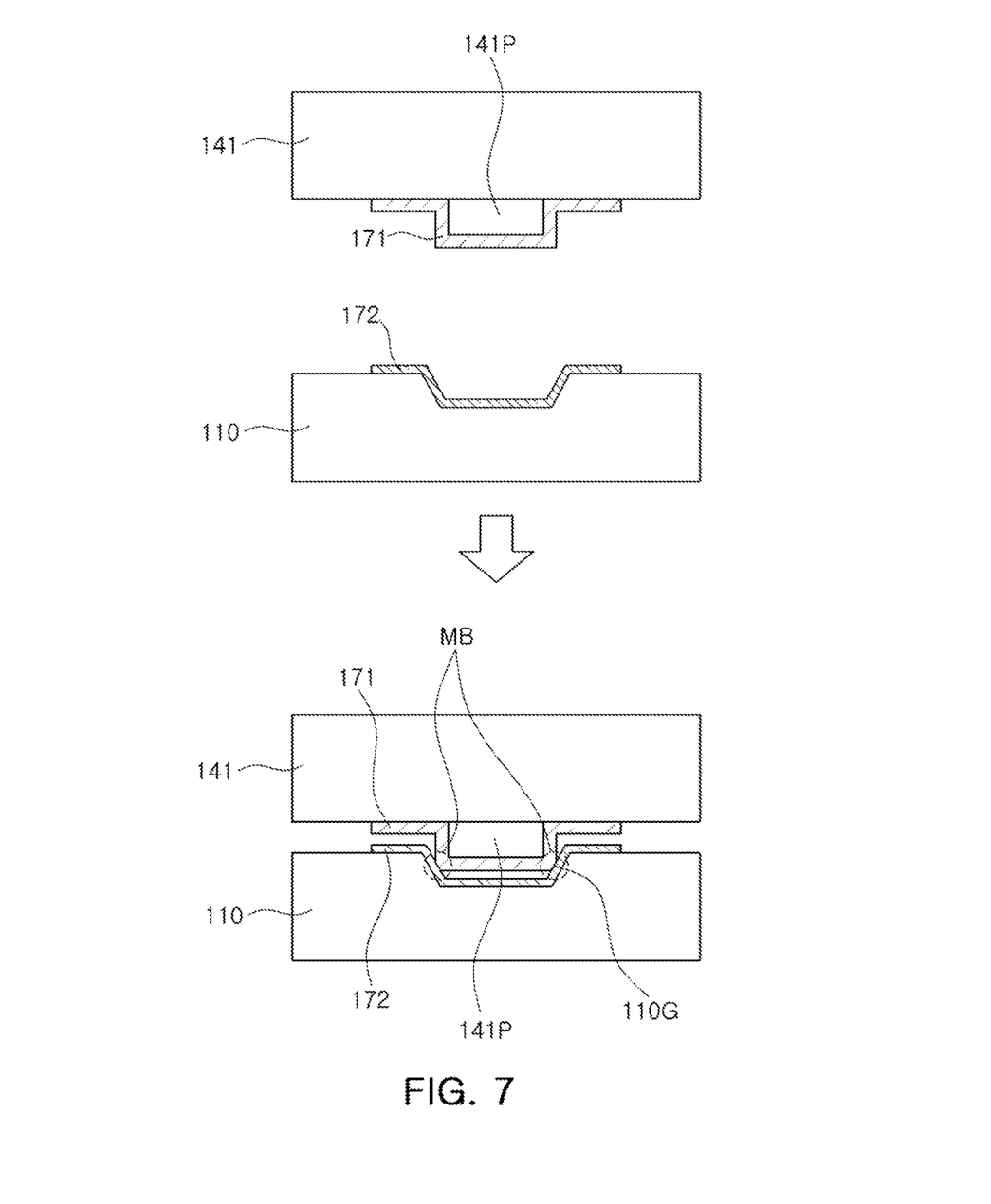
FIG. 7 is a schematic cross-sectional view of manufacturing region A of FIGS. 5 and 6, in accordance with an embodiment.

FIG. 7 is a schematic cross-sectional view of manufacturing region A of FIGS. 5 and 6, in accordance with an embodiment.

Referring to FIG. 7, a process of bonding the cap 140 to the substrate 110 includes forming a first metal layer 171 covering a protrusion 141P formed on a bonding surface 141a of the side wall 141 of the cap 140 and a second metal layer 172 covering a groove 110G formed in a bonding surface 110c of the substrate 110, and bonding the first and second metal layers 171 and 172 by a metal thermal diffusion bonding process.

The metal thermal diffusion bonding process is defined as a method that spreads materials to be bonded, for example, bonding metals, on both surfaces of each of wafers to be bonded and pressing the wafers with heat and a strong force to bond the wafers. In one example, the strong force first functions to press the wafers to have a gap being of a nano size or less, with which the spread bonding metals may be in close proximity to each other and diffuse toward each other. The wafers pressed in such a manner are heated so that the bonding metals of each of the wafers diffuse toward each other, thus, bonding the bonding metals.

As described above, such an MB is formed by bonding a portion of the first metal layer 171 covering the edge of the protrusion 141P of the first metal layer 171 to a portion of the second metal layer 172 covering the inclined wall surface of the groove 100G of the second metal layer 172. Thus, an insertion depth of the protrusion 141P automatically varies to form a regular bonding line. Further, the area of an intermetallic bonding surface may be significantly reduced. Also, as the area of the intermetallic bonding surface increases, when the pressure limit of bonding equipment is exceeded, an intermetallic bonding surface having a fine line width is formed using a process, such as plating or the like, without applying a high level process.

Figure 8:
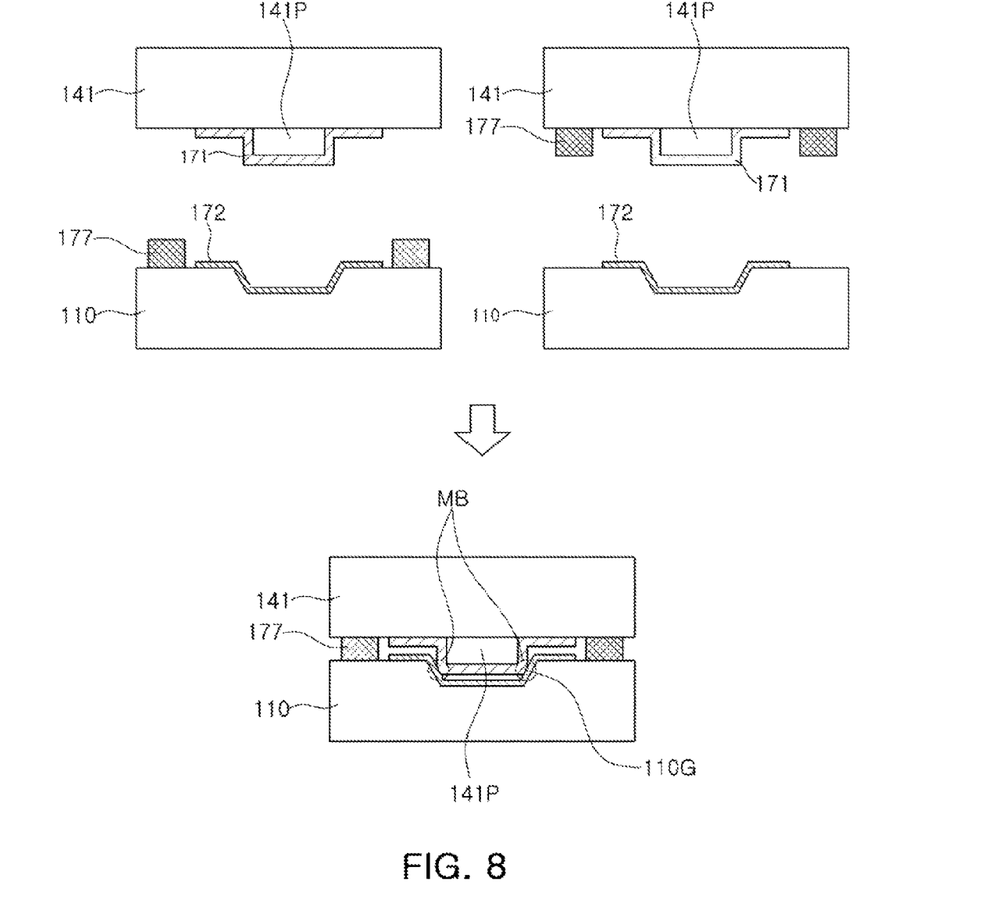
FIG. 8 is a schematic cross-sectional view of another example of manufacturing region A of FIGS. 5 and 6, in accordance with an embodiment.

FIG. 8 is a schematic cross-sectional view of another example of manufacturing region A of FIGS. 5 and 6, in accordance with an embodiment.

Referring to FIG. 8, a process of bonding the cap 140 to the substrate 110 further includes forming a resin layer 177 on the bonding surface 141a of the side wall 141 of the cap 140 or the bonding surface 110c of the substrate 110, and resin-bonding the bonding surface 141a of the side wall 141 of the cap 140 to the bonding surface 110c of the substrate 110 using the resin layer 177. As described above, when the MB and the resin bond are simultaneously applied, the MB and the resin bond are combined in a manner to assist a hermetic seal in an MB region and bonding strength in a resin bonding region.

Figure 9:
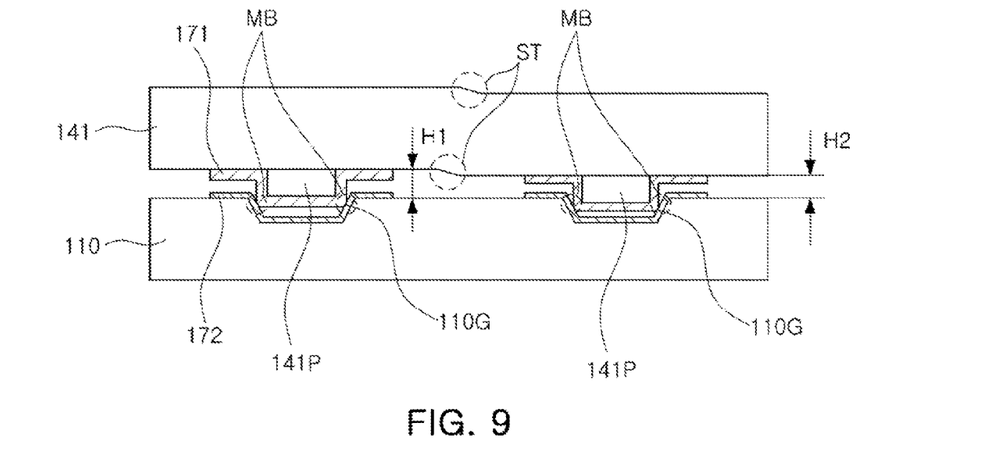
FIG. 9 is a schematic cross-sectional view a bonding structure being applied to an uneven bonding surface, in accordance with an embodiment.

FIG. 9 is a schematic cross-sectional view of a case in which a bonding structure is applied to an uneven bonding surface, in accordance with an embodiment.

Referring to FIG. 9, an element package to which a bonding structure, according to an embodiment, is applied allows insertion depths of protrusions 141P to automatically vary to thus form regular bonding lines, even when bonding heights H1 and H2 are irregular due to a step ST formed on a bonding surface. That is, self alignment is possible.

Figure 10:
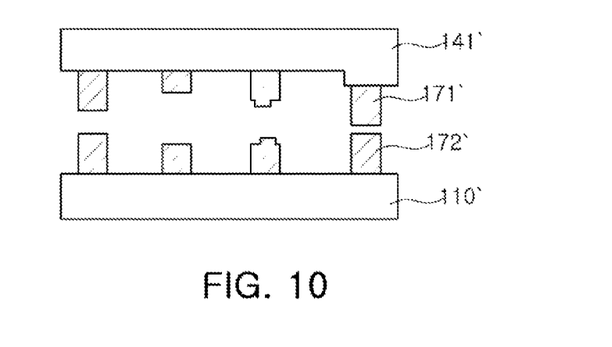
FIG. 10 is a schematic cross-sectional view of a metallic bonding structure.

FIG. 10 is a schematic cross-sectional view of a metallic bonding structure.

Referring to FIG. 10, in one example, when a first metal layer 171' and a second metal layer 172' are formed on a bonding surface of a substrate 110' and a bonding surface of a cap 141', the bonding surface of the substrate 110' or the cap 141' is irregular, or the first and second metal layers 171' and 172' have irregular heights. In this example, when the first and second metal layers 171' and 172' are metallically bonded, a bonding defect in which portions thereof are not bonded may occur. Thus, such example would create an undesirable outcome.

As set forth above, according to various embodiments, an electronic element package having a novel bonding structure in which a cap and a substrate may be firmly bonded regardless of a thickness distribution thereof and a fine bonding line may be formed, and which may significantly reduce the bonding area and may lower manufacturing costs, and a method of manufacturing the same may be provided.

While embodiments have been shown and described above, it will be apparent to those skilled in the art that modifications and variations could be made without departing from the scope of the present disclosure as defined by the appended claims.

For example, the abovementioned embodiments illustrate, as an example, bonding a cap to a substrate and then forming a connecting conductor. However, the present disclosure is not limited thereto, and various modifications, such as first forming a connecting conductor and bonding a cap to a substrate are possible.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic element package comprising:
   a substrate;
   an element disposed on the substrate; and
   a cap enclosing the element,
   wherein one of the substrate and the cap comprises a groove, the other of the substrate and the cap comprises a protrusion engaging with the groove, and a first metal layer and a second metal layer forming a metallic bond with each other in a space between the groove and the protrusion.

2. The electronic element package of claim 1, wherein the groove comprises an inclined wall surface, and the metallic bond is a bond between a portion of the first metal layer covering an edge of the protrusion of the first metal layer and a portion of the second metal layer covering the inclined wall surface of the groove of the second metal layer.

3. The electronic element package of claim 1, wherein the metallic bond comprises a metal thermal diffusion layer.

4. The electronic element package of claim 1, wherein the first metal layer and the second metal layer comprise a same type of material.

5. The electronic element package of claim 1, wherein the substrate and the cap comprise a resin layer disposed in a space therebetween to form a resin bond.

6. The electronic element package of claim 5, wherein the resin layer comprises an epoxy resin.

7. The electronic element package of claim 1, wherein the electronic element package is a BAW resonator.

8. An electronic element package, comprising:
an element disposed on a substrate;
a cap configured to cover the element on the substrate;
a protrusion formed on one of a lower surface of a side wall of the cap or on an upper surface of the substrate;
a first metal layer covering at least one surface of the protrusion;
a groove formed on another of the lower surface of the side wall of the cap or on the upper surface of the substrate; and
a second metal layer covering the groove, wherein a metallic bond is configured between at least a portion of the first metal layer and the second metal layer.

9. The electronic element package of claim 8, wherein the groove is a recess having an inclined wall side surface for line bonding and a flat surface as a bottom surface.

10. The electronic element package of claim 8, wherein, upon the protrusion being formed on the lower surface of the side wall of the cap, the first metal layer extends from a predetermined point on the lower surface of the side wall, covering side surfaces and a lower surface of the protrusion, and extending to another predetermined point of the lower surface of the side wall.

11. The electronic element package of claim 8, wherein, upon the groove being formed on the upper surface of the substrate, the second metal layer extends from a predetermined point on the upper surface of the substrate, covering inclined wall surfaces and a flat surface of the groove, and extending to another predetermined point of the upper surface of the substrate.

12. The electronic element package of claim 8, wherein a resin layer is formed on the bonding surface of the side wall of the cap or the bonding surface of the substrate to resin-bond the lower surface of the side wall of the cap to the upper surface of the substrate using the resin layer.

* * * * *